(12) United States Patent
Lonkar

(10) Patent No.: US 11,363,148 B2
(45) Date of Patent: Jun. 14, 2022

(54) SYSTEMS AND METHODS FOR DETECTING NETWORK OUTAGES

(71) Applicant: T-Mobile USA, Inc., Bellevue, WA (US)

(72) Inventor: Shon Lonkar, Maple Valley, WA (US)

(73) Assignee: T-MOBILE USA, INC., Bellevue, WA (US)

(*) Notice: Subject to any disclaimer, the term of this patent is extended or adjusted under 35 U.S.C. 154(b) by 107 days.

(21) Appl. No.: 17/009,443

(22) Filed: Sep. 1, 2020

(65) Prior Publication Data

US 2022/0070302 A1   Mar. 3, 2022

(51) Int. Cl.
*H04M 15/00* (2006.01)
*H04W 72/04* (2009.01)
*H04W 24/00* (2009.01)

(52) U.S. Cl.
CPC ........... *H04M 15/66* (2013.01); *H04W 24/00* (2013.01); *H04W 72/0406* (2013.01)

(58) Field of Classification Search
CPC .. H04M 15/66; H04W 24/00; H04W 72/0406
See application file for complete search history.

(56) References Cited

U.S. PATENT DOCUMENTS 10,044,553 B2 * 8/2018 Abichandani .......... H04W 4/12

* cited by examiner

*Primary Examiner* — Charles N Appiah
*Assistant Examiner* — Frank E Donado
(74) *Attorney, Agent, or Firm* — Loeb & Loeb LLP

(57) ABSTRACT

A method for cellular network outage detection including monitoring error rates associated with a network node of a cellular network for a first predetermined time period. The method includes determining a first baseline error rate for the network node based on the plurality of first error rates for the first predetermined time period, and determining a first threshold error rate for the network node based on the first baseline error rate for the network node. The method includes monitoring a plurality of second error rates associated with the network node for a time period subsequent the first predetermined time period, and detecting an excessive error rate of the plurality of second error rates associated with the network node, where the excessive error rate exceeding the first threshold error rate. The method includes, in response to detecting the excessive error rate, automatically executing a predetermined override rule.

20 Claims, 6 Drawing Sheets

SYSTEMS AND METHODS FOR DETECTING NETWORK OUTAGES

BACKGROUND

The background description provided herein is for the purpose of generally presenting the context of the disclosure. The work of the presently named inventors, to the extent it is described in this background section, as well as aspects of the description that may not otherwise qualify as prior art at the time of filing, are neither expressly nor impliedly admitted as prior art against the present disclosure.

Cellular networks often include numerous network systems and nodes that process millions of network services requests. At any given point, any of these network nodes may encounter outages or other problems, which may interrupt network services. Network service providers may benefit from improved systems and methods for detecting and addressing network outages.

SUMMARY

The following presents a simplified summary of the present disclosure in order to provide a basic understanding of some aspects of the disclosure. This summary is not an extensive overview of the disclosure. It is not intended to identify key or critical elements of the disclosure or to delineate the scope of the disclosure. The following summary merely presents some concepts of the disclosure in a simplified form as a prelude to the more detailed description provided below.

In an embodiment, the disclosure describes a computer-implemented method for cellular network outage detection. The method may include monitoring error rates for authorization requests between a packet data network gateway (PGW) and a policy and charging rules function (PCRF) of a cellular network for a first time period. The error rates may include rates of denial of service messages from the PCRF. The method may include determining a baseline error rate for the PCRF based on the error rates monitored during the first time period, and determining a threshold error rate for the PCRF based at least partially on the baseline error rate. The method may include detecting an excessive error rate for authorization requests between the PGW and the PCRF during a second time period subsequent the first time period. The excessive error rate may be in excess of the threshold error rate. In response to detecting the excessive error rate in the second time period, the method may include executing an override rule that includes stopping authorization requests between the PGW and the PCRF.

In another embodiment, the disclosure describes a system for improving cellular network outage detection. The system may include a packet data network gateway (PGW) connected to a cellular network. The PGW may be configured to receive and respond to cellular network connection requests from a plurality of mobile devices. The system may include a policy and charging rules function (PCRF) connected to the cellular network. The PCRF may be configured to receive and respond to authorization requests from the PGW. The system may include an outage detection system connected to the PGW. The outage detection system may be configured to determine a baseline error rate for the PCRF based on error rates monitored between the PGW and the PCRF for a first predetermined time period, and determine a threshold error rate based at least partially on the baseline error rate. The outage detection system may also be configured to detect an excessive error rate for authorization requests between the PGW and the PCRF during a second predetermined time period, where the excessive error rate may be in excess of the threshold error rate. In response to detecting the excessive error rate in the second predetermined time period, the outage detection system may be configured to execute an override rule that includes stopping authorization requests between the PGW and the PCRF. The monitored error rates may include rates of denial of service messages from the PCRF to the PGW.

In another embodiment, the disclosure describes a computer-implemented method for cellular network outage detection. The method may include monitoring a plurality of first error rates associated with a network node of a cellular network for a first predetermined time period, and determining a first baseline error rate for the network node based on the plurality of first error rates for the first predetermined time period. The method may include determining a first threshold error rate for the network node based on the first baseline error rate for the network node. The method may include monitoring a plurality of second error rates associated with the network node for a time period subsequent the first predetermined time period, and detecting an excessive error rate of the plurality of second error rates associated with the network node. The excessive error rate may exceed the first threshold error rate. In response to detecting the excessive error rate, the method may include automatically executing a predetermined override rule. The method may include determining a second baseline error rate based on the first baseline error rate and the excessive error rate, and determining a second threshold error rate based at least on the second baseline error rate.

BRIEF DESCRIPTION OF THE DRAWINGS

The invention may be better understood by references to the detailed description when considered in connection with the accompanying drawings. The components in the figures are not necessarily to scale, emphasis instead being placed upon illustrating the principles of the invention. In the figures, like reference numerals designate corresponding parts throughout the different views.

Figure 1:
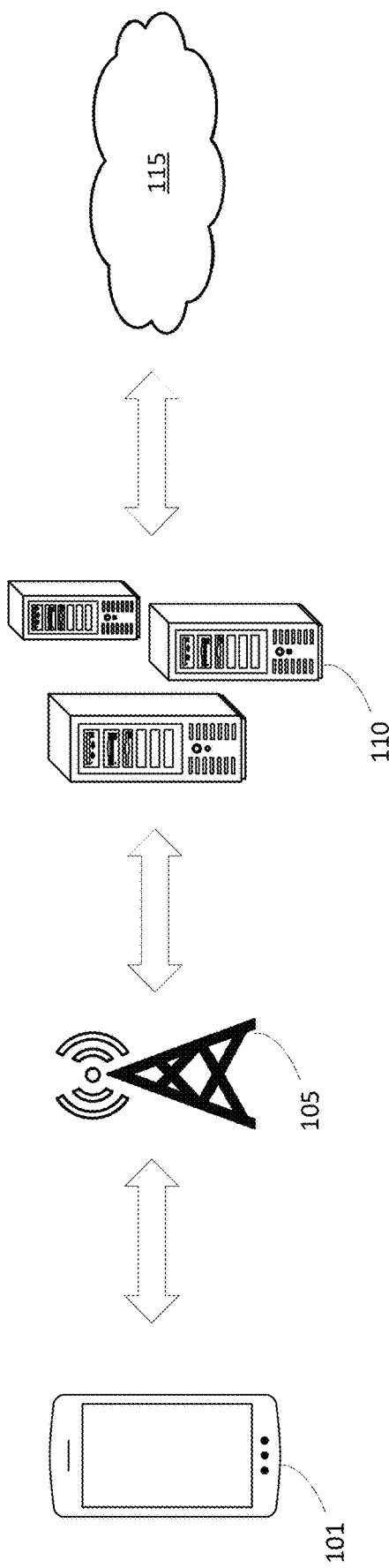
FIG. 1 is a high level diagram of an embodiment of a system for detecting network outages in accordance with the disclosure.

Persons of ordinary skill in the art will appreciate that elements in the figures are illustrated for simplicity and clarity so not all connections and options have been shown to avoid obscuring the inventive aspects. For example, common but well-understood elements that are useful or necessary in a commercially feasible embodiment are not often depicted in order to facilitate a less obstructed view of these various embodiments of the present disclosure. It will be further appreciated that certain actions and/or steps may be described or depicted in a particular order of occurrence while those skilled in the art will understand that such specificity with respect to sequence is not actually required. It will also be understood that the terms and expressions used herein are to be defined with respect to their corresponding respective areas of inquiry and study except where specific meaning have otherwise been set forth herein.

DETAILED DESCRIPTION

The present invention now will be described more fully hereinafter with reference to the accompanying drawings, which form a part hereof, and which show, by way of illustration, specific exemplary embodiments by which the invention may be practiced. These illustrations and exemplary embodiments are presented with the understanding that the present disclosure is an exemplification of the principles of one or more inventions and is not intended to limit any one of the inventions to the embodiments illustrated. The invention may be embodied in many different forms and should not be construed as limited to the embodiments set forth herein; rather, these embodiments are provided so that this disclosure will be thorough and complete, and will fully convey the scope of the invention to those skilled in the art. Among other things, the present invention may be embodied as methods or devices. Accordingly, the present invention may take the form of an entirely hardware embodiment, an entirely software embodiment or an embodiment combining software and hardware aspects. The following detailed description is, therefore, not to be taken in a limiting sense.

Network providers, such as entities providing cellular phone and data service, may use various hardware, software, or other tools and systems to provide systems and methods to detect network outages. In some embodiments, from time to time, certain network systems and nodes may encounter problems that may interrupt network services. In such scenarios, it may be beneficial to quickly identify which system components may be causing the problems, and divert network traffic away from those problematic nodes. For example, in some embodiments, an authorization node, such as a policy and charging rules function (PCRF) or a policy control function (PCF) may encounter a problem and, as a result, may deny authorization request for network services for subscribers that should not be denied. As a result, network services may be adversely affected, and it may take time to identify the particular system causing the problems and remedy those problems.

The systems and methods for detecting network outages described herein may help quickly identify when authorization nodes may be encountering problems by detecting when those nodes are returning higher than expected error messages to a requesting node than expected based on a baseline. Once the error state may be detected, the system may then take mitigating action to minimize the problem's effect on network services for subscribers. The disclosed system, thus, represents a technical solution to the technical problem of quickly determining problem systems in a cellular voice or data network so as to minimize or avoid network service interruptions. The technical solution may also include taking automatic remedial action to at least temporarily remove the suspected problematic systems from the network.

FIG. 1 shows a high level diagram of a portion of a system for detecting network outage as described herein for a Long Term Evolution (LTE) network or other cellular data or voice network (e.g., 2G, 3G, 4G, 5G, GSM, etc.). Mobile devices 101 (e.g., UE for LTE networks) may connect to base stations that make up a radio access network (RAN) 105 via radio signals. The RAN 105 may be one of a variety of network types known to those skilled in the art, such as the Evolved Universal Terrestrial Radio Access Network (E-UTRAN), Universal Mobile Telecommunications System (UMTS), High Speed Packet Access/High Speed Uplink Packet Access (HSPA/HSDPA), etc. In some embodiments, the base stations may include E-UTRAN Node B) ("eNB" or "eNodeB") (e.g., for LTE networks), base transceiver station (BTS) (e.g., for GSM networks), Node B (e.g., for UTRA of UMTS), Home eNodeBs (HeNB), Donor eNodeBs (DeNB), and Relay Nodes (RN), but those skilled in the art will recognize that the RAN may be made up of other suitable types of base stations. In some embodiments, a core network 110, such as the Evolved Packet Core (EPC) or the General Packet Radio Service (GPRS) may then transmit and receive internet protocol (IP) packets to and from an external network 115, such as the Internet. The core network 110 may act as the routing and computing brain of the network. The external network 115 may have a large number of entry and exit points, including the internet and connections to other cellular networks. FIG. 1 illustrates these high-level concepts.

Figure 2:
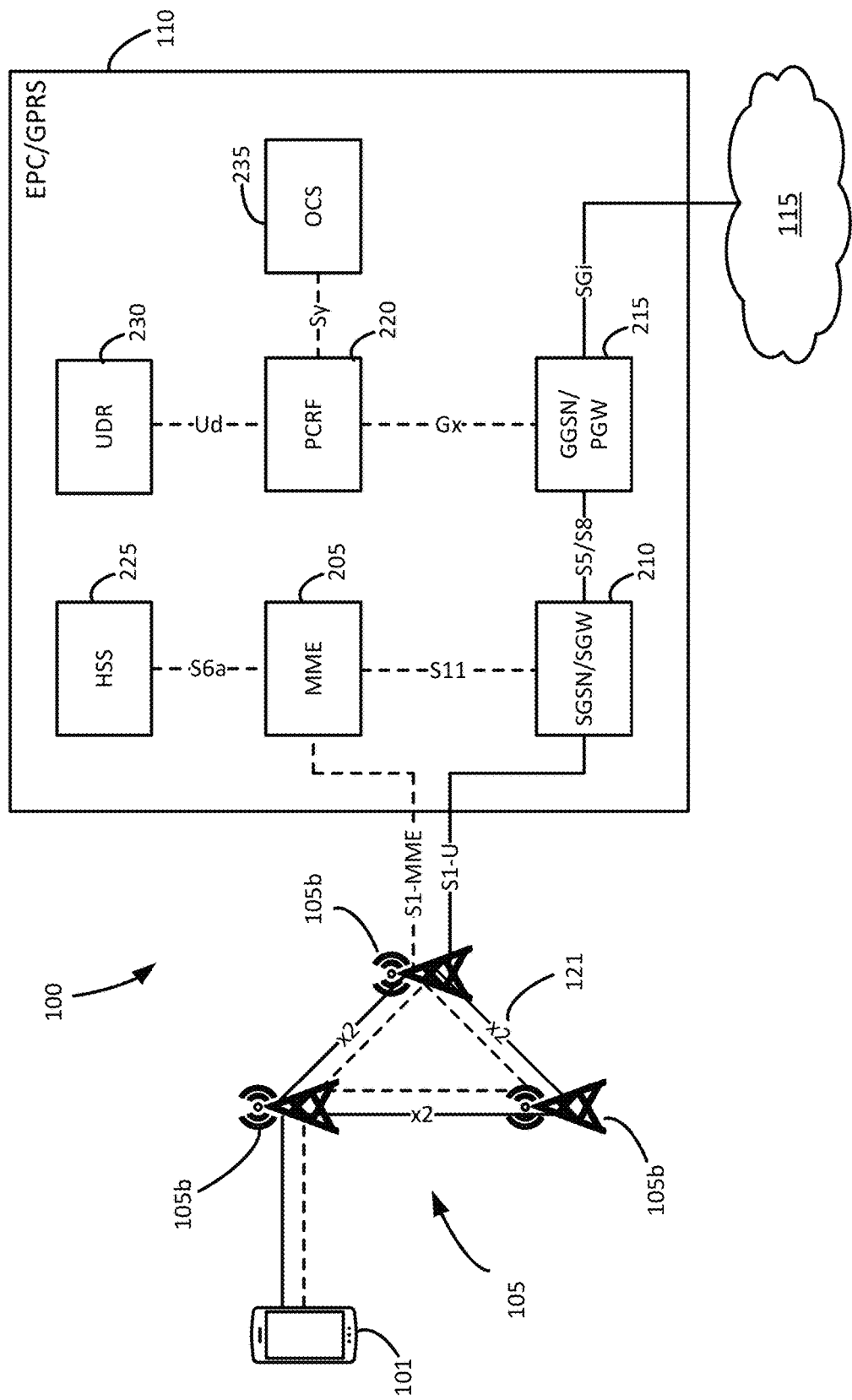
FIG. 2 is a high level diagram of an embodiment of a network environment for a system and methods detecting network outages in accordance with the disclosure.

Mobile devices 101 may connect to the RAN 105 to send data to the external network 115. The RAN 105 may include a mesh network composed of base stations 105b, such as shown in FIG. 2. Each base station 105b may modulate and demodulate radio signals to communicate with mobile devices 101. Base stations 105b may then act as a relay point to create and send IP packets to and from the core network. Referring to FIG. 2, the core network 110 may include an EPC (e.g., for LTE networks). The EPC may include a mobility management entity (MME) 205, serving gateways (SGW) 210, packet data network gateways (PGW) 215, a home subscriber server (HSS) 225, a policy and charging rules function (PCRF) 220. The MME 205 may be a primary network signaling node that may not interact with user traffic. The MME 205 may include a large variation in functionality including managing/storing mobile device contexts, creating temporary IDs, sending pages, controlling authentication functions, and selecting the SGW 210 and PGWs 215. Mobile devices 101 may receive control signals through base stations 105b originating from the MME 205. Each SGW 210 may carry user data, anchor mobile devices 101 for intra-base station (e.g., eNodeB) 105b handoffs, and route information between the PGW 215 and the RAN 105. Each SGW 210 may interface with the MME via a S11 interface protocol.

Each PGW 215 may provide connectivity from the mobile device 101 to external networks by being the point of exit and entry of traffic. A mobile device 101 may have simultaneous connectivity with more than one PGW 215 for accessing multiple packet data networks (PDNs). The PGW may perform policy enforcement, packet filtering for each user, charging support, lawful interception and packet screening. The PGW may also act as the anchor for mobility between 3rd generation partnership project (3GPP) and non-3GPP technologies such as WiMAX and 3GPP2 (CDMA 1X and EvDO). The PGW may interface with one or more SGWs via the S5/S8 protocol, for example.

The PCRF 220 may include rules and policies related to quality of service (QoS) and charging. In some embodiments, access to network resources may be distributed to the PGW 215 and enforced by the PCRF 220. The PCRF 220 may interface with the PGW 215 using the Gx protocol. In some embodiments, the PCRF 220 may be a software node designated in real-time to determine policy rules in the network. The PCRF 220 may be a software component that may operate at the core network 110 and may access subscriber databases and other specialized functions, such as a charging system, in a centralized manner. The PCRF 220 may be the part of the network architecture that aggregates information to and from the network, operational support systems, and other sources (such as portals) in substantially real time, supporting the creation of rules and then automatically making policy decisions for each subscriber active on the network. In some embodiments, a network might offer multiple services, quality of service (QoS) levels, and charging rules. The PCRF 220 may also be integrated with different platforms like billing, rating, charging, and subscriber database or can also be deployed as a standalone entity. In voice over LTE (VoLTE), the PCRF 220 may also be a mediator of network resources for the network for establishing the calls and allocating the requested bandwidth to the call bearer with configured attributes. For any given attempt to access the network, either for a voice call or data transfer, the PGW 215 may have one or more PCRF 220 options with which to interface.

FIG. 2 depicts some of the components introduced above and shows the data flows between these network components. This graphic may serve as reference to visualize the interconnected fundamental LTE network components and may depict concepts not yet discussed. The solid lines in the diagram depict user traffic, while the dashed lines depict control signaling traffic.

In embodiments that include a GSM network, a GPRS may be used instead of or in addition to an EPC. The GPRS may support packet switching traffic in a GSM network. The GPRS may include a gateway GPRS support node (GGSN) instead of a PGW and a serving GPRS support node (SGSN) 210 instead of an SGW. The GGSN 215 may be responsible for the interworking between the GPRS network and external packet switched networks, like the Internet and X.25 networks. In some embodiments, such as 5G network embodiments, the PGW 215 may be replaced by a session management function (SMF) and the PCRF 220 may be replaced by a policy control function (PCF), and perform analogously as described herein. Other differences in components across different networks may be apparent to those skilled in the art.

In some embodiments, the core network 110 may also include a user data repository (UDR) 230 and an online charging system (OCS) 235. The OCS 235 may be system that may allow a communications service provider to charge its customers, in substantially real time, based on service usage. In some embodiments, the OCS may interface with the PCRF via the Sy protocol. The UDR 230 may be a functional entity that may act as a single logical repository of user data. Entities that do not store user data and that need to access user data stored in the UDR 230 are collectively known as application front ends. Application Front Ends may connect to the UDR 230 through the reference point named Ud to access user data.

Figure 3:
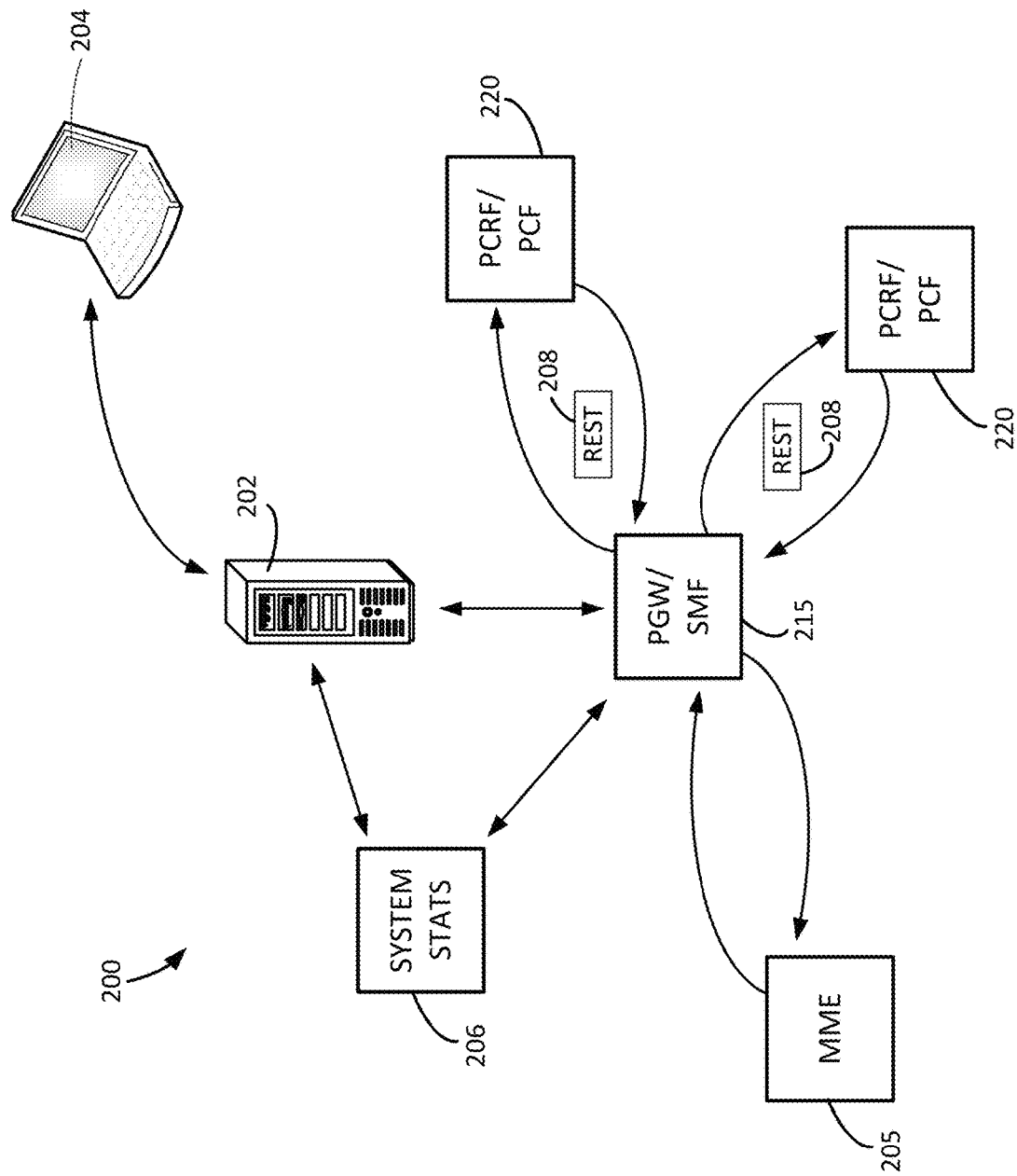
FIG. 3 is a diagram of components of an embodiment of the system for detecting network outages of FIG. 1.

FIG. 3 shows an embodiment of a computer environment 200 in which embodiments of the disclosed system for network outage detection may operate. In some embodiments, the computing environment 200 may include at least one outage detection system 202. In some embodiments, the outage detection system 202 may be a server-type computing device specially configured to operate the system for network outage detection and communicate with one or more systems of the core network 110, such as the PGW 215 or SMF, the MME, 205, and/or the PCRF 220 or PCF. The outage detection system 202 may, in some embodiments, also be connected to a client device 204. The client device 204 may be any type of suitable computing device capable of interfacing with the outage detection system 202 via a data network such as the Internet, a local area network, a direct or wireless connection, using any suitable interface known to those skilled in the art, such as HTTP, simple object access protocol (SOAP), REST, etc. In some embodiments, the outage detection system 202 may be configured to provide outage status and reports to the client device 204 automatically or upon request. In some embodiments, the PGW 215 may interface with the PCRF 220 via a REST interface. The PGW 215 may connect or otherwise interface with the MME 205, or other core network components. Further details on example embodiments of these connections and associated interfaces are described in reference to FIG. 1 above.

In some embodiments, the computing environment 200 may include a system stats node 206 that may be accessible by the outage detection system 202. The system stats node 206 may be a separate server-type computing device in some embodiments, or may be a part of the PGW 215 or outage detection system 202 in some embodiments. Regardless of location, the system stats node 206 may monitor and/or store statistics related to the performance of the components in the core network 110, such as the PGW 215, the PCRF 220, and the MME 205. In some embodiments, the system stats node 206 may particularly store statistics related to key performance indicators (KPI) related to system and network performance. In some embodiments, the KPI may relate to quality of service (QoS) experienced by subscribers that may affect call or data service. For example, the KPI may include session events per second (SEPS), Gx response 5003 error count and/or error count per second, N7 401 error or 403 error (4xx error) count and/or count per second, other denial of service messages from the PCRF 220 to the PGW 215, traffic channel congestion, call success rate, etc. In some embodiments, each node in the core network 110, such as each PGW 215 or each PCRF 220, may monitor and store its own KPI. For example, a core network or a portion of a network in a particular region may include hundreds of PGW 215 nodes, each of which may monitor and store its own KPI in a local director or remotely. The KPI data may include data related to both incoming and outgoing traffic to and from each PGW 215. In some embodiments, the system stats node 206 may, either continuously or periodically, fetch KPI data from each PGW 215 or other node using a suitable interface method, such as via HTTP GET commands, requesting the data via HTTP POST commands, or other HTTP commands. In some embodiments, the outage detection system 202 may fetch KPI data directly from each PGW 215 instead of (or in addition to) receiving the KPI data from a system stats node 206.

In some embodiments, under nominal conditions, each PGW 215 may receive request to access network resources via an MME 205 or other core network 110 system. The PGW 215 may interface with a PCRF 220 to determine whether the particular request should be granted depending on information available to the PCRF, such as a particular subscriber's policy status, data consumption status, or other subscriber information. For example, if a particular subscriber requests data service, the PCRF 220 may determine that the subscriber has not exceeded a data limit for the subscriber's policy and transmit a return message to the PGW 215 to proceed with the request. If, however, the PCRF 220 determines that the particular subscriber should not receive data service for whatever reason, the PCRF 220 may return a denial of service message indicating that the PGW 215 should not proceed with the requested service. In some embodiments, each PCRF 220 may process and return hundreds, thousands, or even millions of transactions (e.g., request and response pairs) per second.

When all network systems may be working properly, each PCRF 220 may return messages denying service for a particular network request based on a variety of legitimate reasons. The rate of denial of service messages received from each PCRF 220 may vary from second to second, such as 50 errors per second one second, 200 errors per second the following second, etc. In some embodiments, the rate of errors per second for each PCRF 220 may be recorded and stored at each respective PGW 215 as part of the KPI data related to the PGW. In some embodiments, as described above, a system stats node 206 and/or the outage detection system 202 may retrieve or otherwise monitor this KPI data, including the error rates for denial of service messages from each PCRF 220. In some embodiments, the denial of service messages error count may be Gx response 5003 errors, 4xx response errors, etc., depending on the type of network and interface used. Those skilled in the art will recognize that different types of data and errors may be stored and tracked in accordance with the methods and systems described herein.

Figure 4:
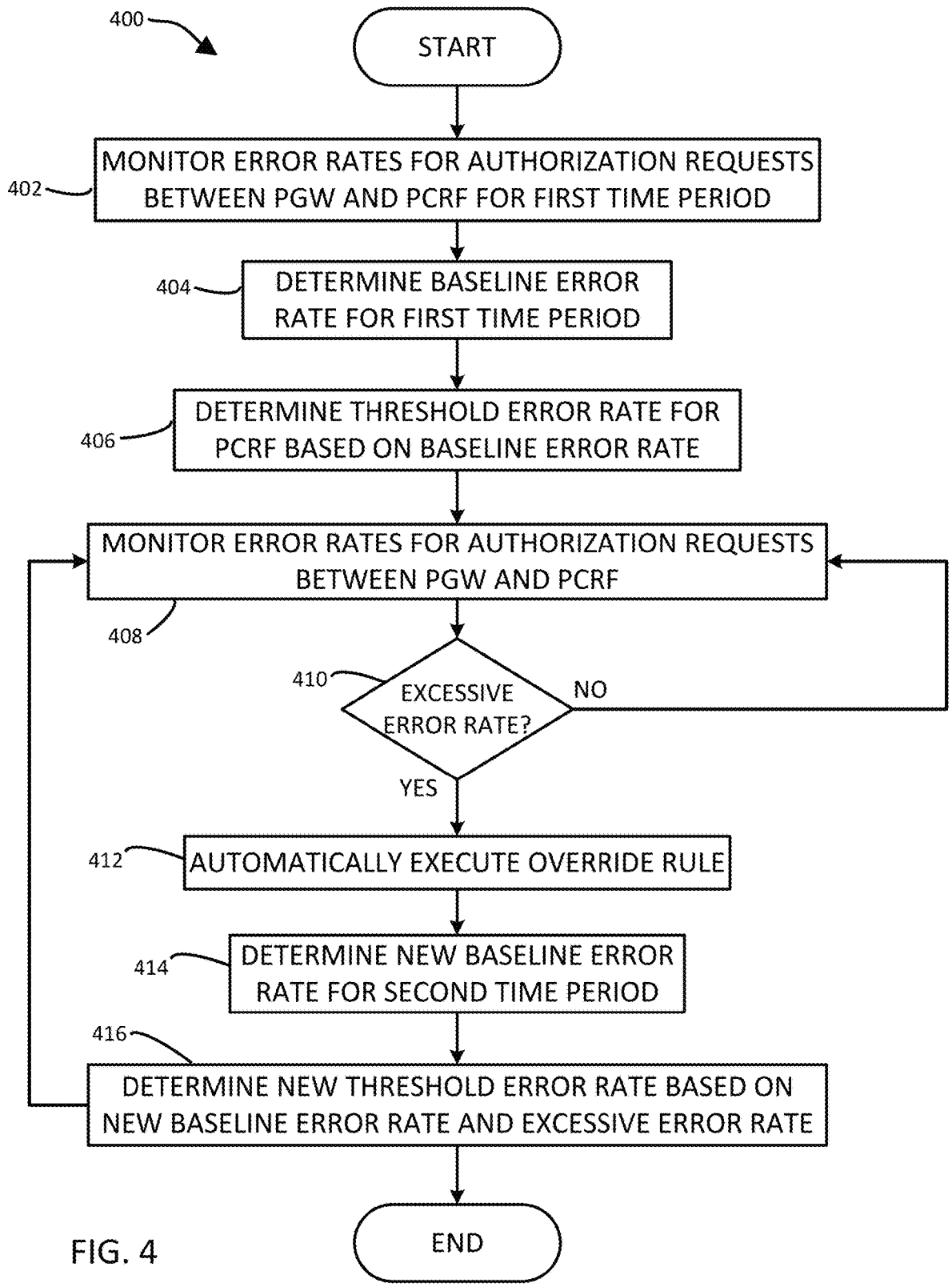
FIG. 4 is a flowchart of an embodiment of a method of detecting network outages using the system of FIG. 1.

FIG. 4 illustrates an embodiment of a method 400 for using the outage detection system 202 to detect network outages and take action to address or limit the outage's effect on the network and subscriber's access to network services. At 402, the method may include monitoring error rates for authorization requests or other types of requests between each PGW 215 and each PCRF 220 to which each PGW 215 has access for a first time period. Although the method 400 describes interactions between PGW 215 and PCRF 220, it should be understood that other types of network nodes may be monitored for similar KPI data in accordance with the disclosure. A PGW and SMF may be examples of requesting nodes, and the PCRF and PCF may be examples of authorization nodes. For example, a given geographic region may be served by one or more PGWs, and each PGW may have access to one or more PCRFs depending on various conditions. The first time period may be any suitable time period deemed to be sufficiently representative of network performance, e.g., one day, 1 week (7 days), one month, etc. At 404, the method 400 may include determining a baseline error rate for the first time period. The baseline error rate may be determined in a variety of ways, including determining an average error rate for the first time period, determining a maximum error rate for the first time period, determining a median error rate for the first time period, or other suitable methods based on the error rates monitored during the first time period. Additionally, in some embodiments, the method may include determining a baseline error rate for each PCRF using error data from each particular PCRF, while other embodiments may include determining a baseline error rate using data from a plurality of PCRFs.

At 406, the method may include determining a threshold error rate for each PCRF 220 or other authorization node that may be at least partially based on the baseline error rate determined for the first time period. In some embodiments, the threshold error rate may be determined by taking a multiple or other factor of the baseline error rate. In some embodiments, the threshold error rate may be determined to be 400% of the baseline error rate, or 300% of the baseline error rate, or 200% of the baseline error rate, or 150% of the baseline error rate, or 125% of the error rate, or 100% of the baseline error rate (e.g., equal to the baseline error rate), or any other suitable multiple or percentage of the baseline error rate. For example, if the baseline error rate is determined to be 200 errors per second over the first time period, a threshold error rate determined based on taking 200% of the baseline error rate would be 400 errors per second. If the baseline error rate is determined to be 100 errors per second over the first time period, a threshold error rate determined based on taking 200% of the baseline error rate would be 200 errors per second. In some embodiments, the threshold error rate may be determined based on determining the average error rate for the first time period and adding 20% (e.g., multiple by 1.2), or 30%, or 40%, or 50%.

At 408, the method may include monitoring error rates for authorization requests between each requesting node (e.g., PGW 215 or SMF) and each authorization node (e.g., PCRF 220 or PCF) for a second time period subsequent the first time period. In some embodiments, the second time period may have the same or different length than the first time period, or may be an ongoing time period without a predetermined length. At 410, the method 400 may include detecting whether the error rate for a monitored PCRF 220 or other authorization node may be an excessive error rate during the second time period, where the excessive error rate is an error rate that may exceed the determined threshold error rate. For example, continuing the error rate example numbers above, an excessive error rate may occur if the threshold error rate is determined to be 400 errors per second and an error rate during the second time period is detected to be 440 errors per second. In some embodiments, detection of an excessive error rate may indicate that the PCRF or other authorization node may be experiencing a problem resulting in excess authorization denials. Such a problem may result in illegitimately denying network services to subscribers that should be receiving network services under their policy.

In response to detecting an excessive error rate, the method may include, at 412, automatically executing an override rule. In some embodiments, the override rule may be an action taken to mitigate effects of a potential problem with the particular PCRF or other authorization node that may be returning error rates in excess of the threshold. In some embodiments, the override rule may include at least temporarily closing the connection between the PGW 215 or other requesting node and the PCRF 220 or other authorization node that may be returning excessive error rates. In some embodiments, closing the connection between the PGW 215 and the problematic PCRF may force the PGW to default to using a static rule for responding to a connection request without querying any PCRF. In some embodiments, the default static rule may be to automatically authorize all network requests. Such a rule may allow substantially all requested network traffic to proceed so that both legitimate and illegitimate network service requests may be authorized in order to prevent legitimate requests from being wrongfully denied. Such a rule may help limit network services problems encountered by subscribers who should be receiving service, thus boosting quality of service and customer satisfaction. In some embodiments, the override rule may include transferring all authorization request traffic from the problematic primary PCRF 220 to a secondary PCRF 220 accessible to the PGW 215 that may not have experienced excessive error rates. In such embodiments, the secondary PCRF 220 may receive and process substantially all the authorization requests that may have otherwise been sent to the primary PCRF. In such embodiments, the override rule may reduce denial of legitimate network services requests by routing authorization requests away from the problematic primary PCRF and to the secondary PCRF that has not experienced excessive error rates. Other types of override rules in response to detecting excessive error rates may be contemplated in accordance with the disclosure that may mitigate the amounts of unwarranted denials of authorization requests to legitimate subscriber requests. In some embodiments, the method may include transmitting a message to a client device 204 indicating that an excessive error rate has been detected and/or that an override rule has been executed in response.

At 414, the method 400 may include determining a new baseline error rate for the second time period, e.g., a second baseline error rate. In some embodiments, the second baseline error rate may be determined based at least partially on the original baseline error rate (e.g., first baseline error rate) and any excessive error rates detected during the second time period. For example, in some embodiments, the second baseline error rate may be determined by taking an average of the first baseline error rate and any instance of an excessive error rate detected during the second time period. In some embodiments, the first time period may be a seven day period, and the second time period may be a subsequent seven day time period. At 416, the method may include determining a new threshold (e.g., second threshold error rate) based at least partially on the second baseline error rate. In such embodiments, the originally determined threshold rate may be a first threshold error rate, and the new threshold error rate may be a second threshold error rate. In some embodiments, the second threshold error rate may be determined as, for example, 20% more than the second baseline error rate. In one exemplary embodiment, the first and second baseline error rates and first and second threshold error rates may be determined as shown in Table 1. It should be understood, however, that the numbers for error rate and threshold calculation (e.g., baseline error rate plus 20%) are merely exemplary.

TABLE 1

| Error Rate Name | Error Rate | Reason |
| --- | --- | --- |
| First Baseline Error Rate (BER1) | 200 errors per second | Average error rate for first time period (e.g., 7 days) |
| First Threshold Error Rate (TER1) | 240 errors per second | BER1 + 20% |
| Excessive Error Rate 1 (EER1) | 240 errors per second | Exceeds TER1 in second time period (e.g., next 7 days) |
| Excessive Error Rate 2 (EER2) | 300 errors per second | Exceeds TER1 in second time period |
| Excessive Error Rate 3 (EER3) | 350 errors per second | Exceeds TER1 in second time period |
| Second Baseline Error Rate (BER2) | 272.5 errors per second | Average of BER1, EER1, EER2, EER3 |
| Second Threshold Error Rate (TER2) | 327 errors per second | BER2 + 20% |

In the example in Table 1, the second threshold error rate (TER2) increased from the first threshold error rate (TER1) because the first threshold error rate was exceeded during the second time period. Those skilled in the art will understand that the same process may be repeated for subsequent time periods (e.g., third time period, fourth time period, etc.), with new baseline and new threshold error rates being determined for each time period. Once time periods begin to pass without any excessive error rates detected, the baseline and threshold error rates may begin to decline back toward the original baseline, which may indicate that whatever underlying problems encountered with the authorization node may have been solved.

Figure 5:
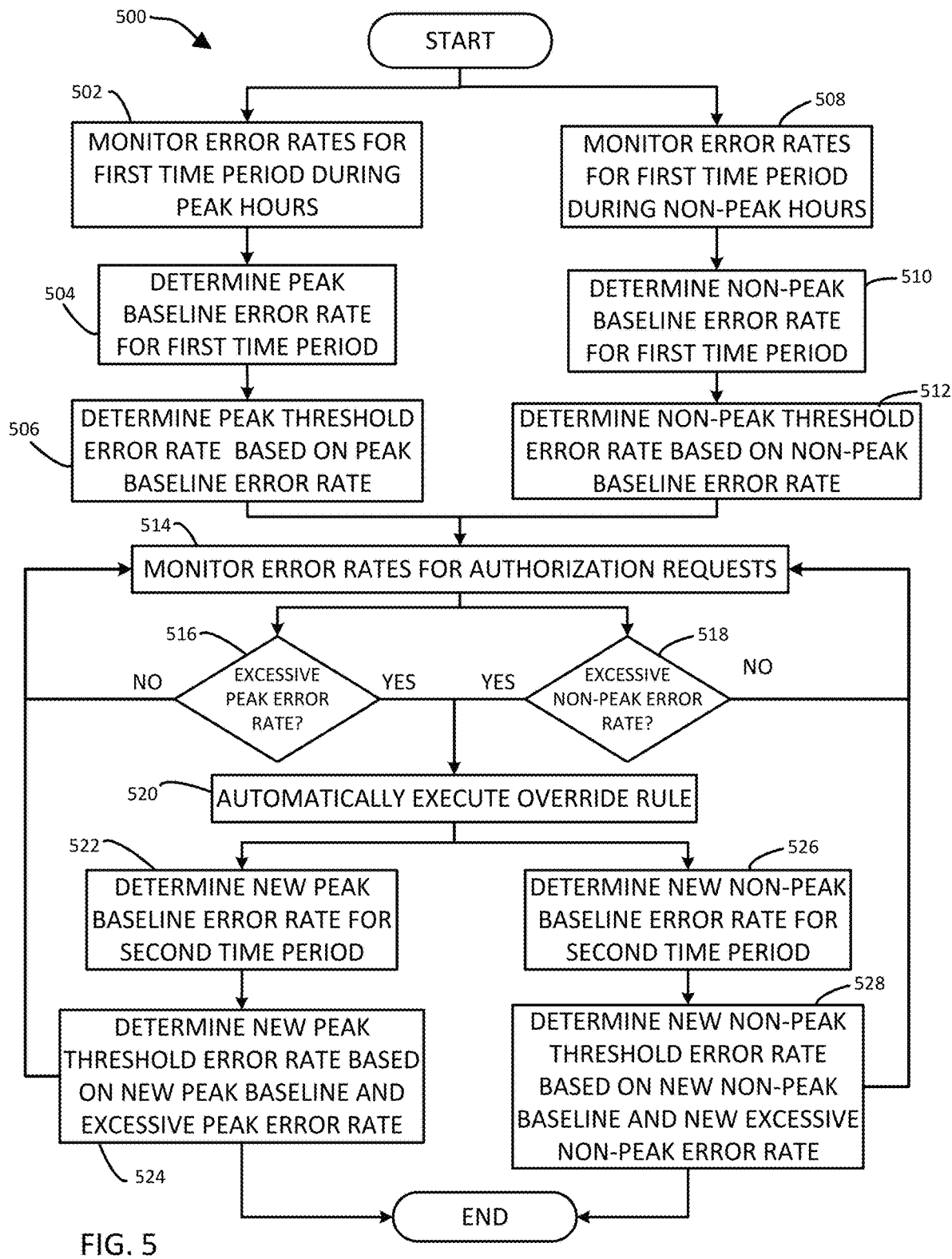
FIG. 5 is a flowchart of another embodiment of a method of detecting network outages using the system of FIG. 1.

The demand for network services for any given geographic region serviced by one or more PGWs 215 and PCRFs 220 may vary based on several factors, including the time of day. For example, requests for network services may be more numerous during the daytime hours when subscribers may be more likely to be awake and using their devices rather than nighttime hours when most subscribers may be asleep. As such, FIG. 5 illustrates an embodiment of a method 500 for using the outage detection system 202 to determine different baseline and threshold error rates for peak usage hours and for non-peak usage hours. Peak and non-peak hours may vary by region, and may be determined as a function of transaction request volume. In one example, peak hours may be between 5 AM and 10 PM for a particular region, and non-peak hours may be between 10 PM and 5 AM the following day. In other embodiments, peak hours may be between 6 AM and 10:30 PM, and non-peak hours may be between 10:30 PM and 6 AM the following day. It should be understood that the specific hours defining peak hours and non-peak hours may vary so long as different time periods may be determined based on user traffic. In some embodiments, more than two types of time frames may be used, such as first peak, second peak, and non-peak hours, where the more than two time periods may be differentiated in some suitable manner in accordance with the disclosure.

In some embodiments, because peak hours may include more network traffic than non-peak hours, lower error rates for authorization requests to the authorization node (e.g., PCRF 220) may be occur for a given time period. Accordingly, in some embodiments, the method 500 may include determining a peak baseline error rate as a baseline for errors occurring during peak hours and a non-peak error rate as a baseline for errors occurring during non-peak hours. For example, in some embodiments, the peak baseline error rate may be around 200 errors per second, and the non-peak baseline error rate may be around 100 errors per second. In some embodiments, the peak baseline error rate may be used to determine a peak threshold error rate, and the non-peak baseline error rate may be used to determine a separate non-peak threshold error rate. For example, the peak threshold error rate may be the peak baseline error rate (e.g., 200 errors per second) plus 20% (e.g., 240 errors per second), and the non-peak threshold error rate may be the non-peak baseline error rate (e.g., 100 errors per second) plus 20% (eg., 120 errors per second). With two (or more) separate threshold error rates for peak and non-peak hours, the outage detection system 202 may more accurately determine whether a PCRF 220 or other authorization node may be encountering problems that need service or other attention.

At 502, the method 500 may include monitoring error rates during a first time period during peak hours, such as error rates between a requesting entity (e.g., PGW 215) and an authorizing entity (e.g., PCRF 220) between 5 AM and 10 PM. The types of errors monitored in the method 500 may be the same or similar to those described above with regard to the method 400, monitored between the same or similar types of network nodes as described in method 400. At 508, the method may include monitoring error rates during the first time period during non-peak hours, such as between 10 PM and 5 AM. At 504, the method 500 may include determining a peak baseline error rate for the first time period, which may be a baseline error rate similar to that determined above in method 400, but applicable only during peak hours. At 510, the method 500 may include determining a non-peak baseline error rate for the first time period, which may be a baseline error rate similar to that determined above in method 400, but applicable only during non-peak hours. At 506, the method 500 may include determining a peak threshold error rate based on the peak baseline error rate, where the peak threshold error rate may be similar to the threshold error rates described in method 400 but applicable only during peak hours. At 512, the method 500 may include determining a non-peak threshold error rate based on the non-peak baseline error rate, where the non-peak threshold error rate may be similar to the threshold error rates described in method 400 but applicable only during non-peak hours.

At 514, the method may include monitoring the error rates, such as error rates for authorization requests between a PGW 215 or SMF and a PCRF 220 or PCF, respectively, in some embodiments. The method may include monitoring the error rates during a second time period that may be subsequent to the first time period. In some embodiments, the second time period may have the same or different length than the first time period, or may be an ongoing time period without a predetermined length. At 516, the method 500 may include determining whether an excessive peak error rate is detected during peak hours of the second time period, and at 518, the method may include determining whether an excessive non-peak error rate is detected during non-peak hours of the second time period. If neither peak nor non-peak excessive error rates are detected during the second time period, the method may include continuing to monitor error rates for subsequent time periods at 514. If either the excessive peak error rate is detected during peak hours or the excessive non-peak error rate is detected during non-peak hours, the method may include, at 520, automatically executing an override rule. As described above, the override rule may include various actions, such as actions for mitigating or limiting disruption of network services as a result of a potential problem with the PCRF or PCF, for example.

At 522, the method 500 may include determining a new peak baseline error rate for the second time period. In some embodiments, the new (e.g., second) peak baseline error rate may be determined based at least partially on the original peak baseline error rate (e.g., first peak baseline error rate) and any excessive peak error rates detected during the second time period. As described above, the second peak baseline error rate may be determined by taking an average of the first peak baseline error rate and any instance of an excessive peak error rate detected during the peak hours of the second time period. At 526, the method may includes determining a new non-peak baseline error rate for the second time period. In some embodiments, the new (e.g., second) non-peak baseline error rate may be determined based at least partially on the original non-peak baseline error rate (e.g., first non-peak baseline error rate) and any excessive non-peak error rates detected during the second time period. As described above, the second non-peak baseline error rate may be determined by taking an average of the first non-peak baseline error rate and any instance of an excessive non-peak error rate detected during the non-peak hours of the second time period.

At 524, the method 500 may include determining a new peak threshold error rate (e.g., second peak threshold error rate) based on the new (e.g., second) peak baseline error rate and any new excessive peak error rates detected during the peak hours of the second time period. At 528, the method 500 may include determining a new non-peak threshold error rate (e.g., second non-peak threshold error rate) based on the new (e.g., second) non-peak baseline error rate and any new excessive non-peak error rates detected during the non-peak hours of second time period. As described above with reference to method 400, the second peak and non-peak error rates may be determined in a variety of suitable ways in accordance with the disclosure.

At least one technical effect of the system and methods described herein is increased network reliability as a result of quickly identifying problematic network nodes and automatically removing those identified nodes from the network. This technical effect solves at least the technical problem of denying network access to subscribers who should not be denied access. Automatically identifying network outages and reducing the negative effects of those outages may increase network efficiency and improve network reliability. More efficient and automatic identification of potential network outages may also result in more efficient network troubleshooting due to more accurate identification of the problem's source.

Figure 6:
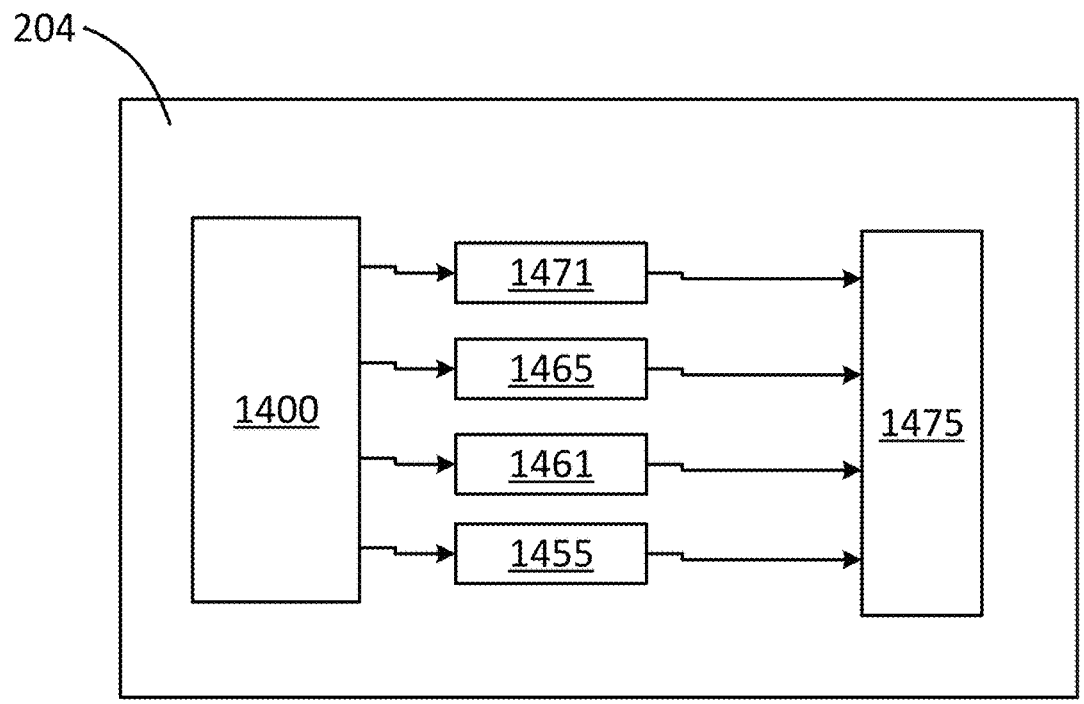
FIG. 6 is a schematic illustration of elements of an embodiment of an example computing device.
Figure 7:
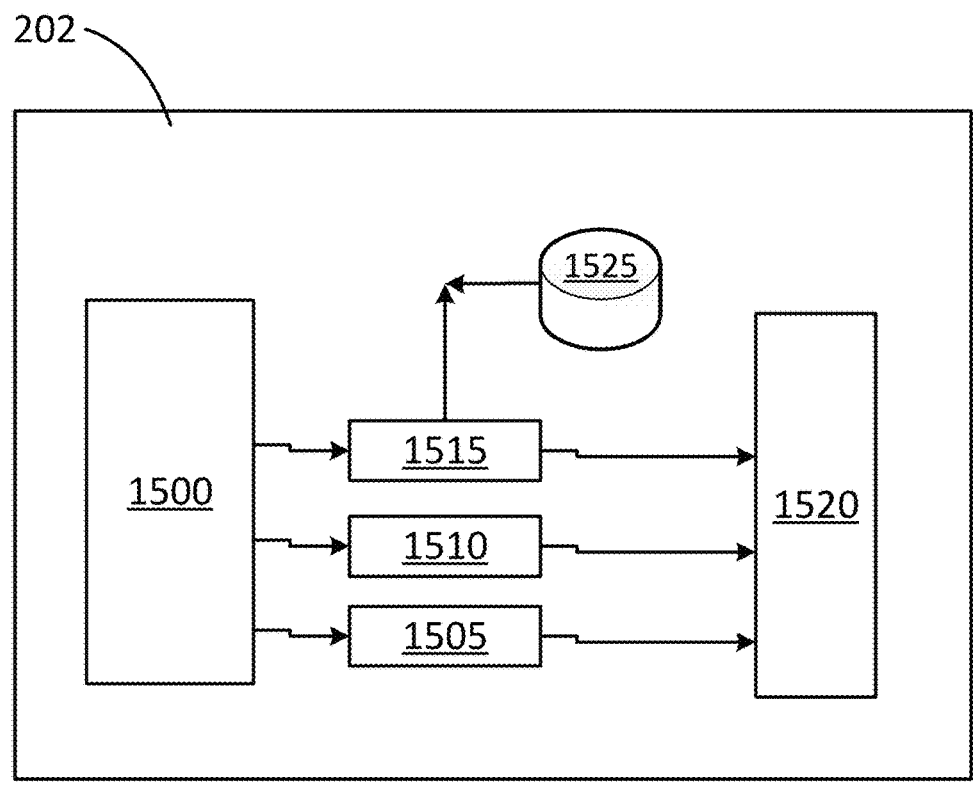
FIG. 7 is a schematic illustration of elements of an embodiment of a server type computing device.

FIG. 6 is a simplified illustration of the physical elements that make up an embodiment of a computing device, such as the client device 204, and FIG. 7 is a simplified illustration of the physical elements that make up an embodiment of a server type computing device, such as may be used for the outage detection system 202. Referring to FIG. 6, a sample computing device is illustrated that is physically configured to be part of the systems and method for detecting network outages. The computing device 204 may have a processor 1451 that is physically configured according to computer executable instructions. In some embodiments, the processor may be specially designed or configured to optimize communication between a server such as system server 202 and the computing device 204 relating to the system described herein. The computing device 204 may have a portable power supply 1455 such as a battery, which may be rechargeable. It may also have a sound and video module 1461 which assists in displaying video and sound and may turn off when not in use to conserve power and battery life. The computing device 204 may also have volatile memory 1465 and non-volatile memory 1471. The computing device 204 may have GPS capabilities that may be a separate circuit or may be part of the processor 1451. There also may be an input/output bus 1475 that shuttles data to and from the various user input/output devices such as a microphone, a camera, a display, or other input/output devices. The computing device 204 also may control communicating with networks either through wireless or wired devices. Of course, this is just one embodiment of a computing device 204 and the number and types of computing devices 204 is limited only by the imagination.

The physical elements that make up an embodiment of a server, such as the outage detection system server 202, are further illustrated in FIG. 7. In some embodiments, the client system server may be specially configured to run the system and methods for detecting network outages as disclosed herein. At a high level, the outage detection system server 202 may include a digital storage such as a magnetic disk, an optical disk, flash storage, non-volatile storage, etc. Structured data may be stored in the digital storage a database. More specifically, the server 202 may have a processor 1500 that is physically configured according to computer executable instructions. In some embodiments, the processor 1500 can be specially designed or configured to optimize communication between a computing device, such as computing device 204, or between other system nodes such as a requesting node, and the server 202 relating to the system as described herein. The server 202 may also have a sound and video module 1505 which assists in displaying video and sound and may turn off when not in use to conserve power and battery life. The server 202 may also have volatile memory 1510 and non-volatile memory 1515.

A database 1525 for digitally storing structured data may be stored in the memory 1510 or 1515 or may be separate. The database 1525 may also be part of a cloud of servers and may be stored in a distributed manner across a plurality of servers. There also may be an input/output bus 1520 that shuttles data to and from the various user input devices such as a microphone, a camera, a display monitor or screen, etc. The input/output bus 1520 also may control communicating with networks either through wireless or wired devices. In some embodiments, a user data controller for running a user data API may be located on the computing device 204. However, in other embodiments, the user data controller may be located on server 202, or both the computing device 204 and the server 202. Of course, this is just one embodiment of the client system server 202 and additional types of servers are contemplated herein.

The figures depict preferred embodiments for purposes of illustration only. One skilled in the art will readily recognize from the following discussion that alternative embodiments of the structures and methods illustrated herein may be employed without departing from the principles described herein.

Upon reading this disclosure, those of skill in the art will appreciate still additional alternative structural and functional designs for the systems and methods described herein through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the systems and methods disclosed herein without departing from the spirit and scope defined in any appended claims.

The invention claimed is:

1. A computer-implemented method for cellular network outage detection, the method comprising:
    receiving requests for connection to a cellular network from a plurality of mobile devices over the cellular network;
    sending, in response to the cellular network connection requests, authorization requests between a packet data network gateway (PGW) connected to the cellular network and a policy and charging rules function (PCRF) of the cellular network for a first time period;
    monitoring error rates for the authorization requests for the first time period, the error rates including rates of denial of service messages from the PCRF;
    determining a baseline error rate for the PCRF based on the error rates monitored during the first time period;
    determining a threshold error rate for the PCRF based at least partially on the baseline error rate;
    detecting an excessive error rate for authorization requests between the PGW and the PCRF during a second time period subsequent the first time period, the excessive error rate being in excess of the threshold error rate; and
    in response to detecting the excessive error rate in the second time period, executing an override rule that includes stopping authorization requests between the PGW and the PCRF.

2. The method of claim 1, wherein executing the override rule further comprises allowing cellular network connection requests from mobile devices received subsequent to stopping the authorization requests between the PGW and the PCRF.

3. The method of claim 1, wherein the threshold error rate is a first threshold error rate, and wherein the method further comprises determining a second threshold error rate based on a second baseline error rate and the excessive error rate.

4. The method of claim 1, wherein the PCRF is a first PCRF, and wherein the override rule includes directing authorization requests for cellular network connection requests received subsequent to stopping the authorization requests between the PGW and the first PCRF to a second PCRF instead of the first PCRF.

5. The method of claim 1, wherein the baseline error rate is an average error rate of the error rates monitored during the first time period.

6. A system for improving cellular network outage detection, the system comprising:
    a packet data network gateway (PGW) connected to a cellular network, the PGW configured to receive and respond to cellular network connection requests from a plurality of mobile devices;
    a policy and charging rules function (PCRF) connected to the cellular network, the PCRF configured to receive and respond to authorization requests from the PGW, in response to the cellular network connection requests; and
    an outage detection system connected to the PGW, the outage detection system configured to:
        determine a baseline error rate for the PCRF based on error rates for the authorization requests that are monitored between the PGW and the PCRF for a first predetermined time period,
        determine a threshold error rate based at least partially on the baseline error rate,
        detect an excessive error rate for authorization requests between the PGW and the PCRF during a second predetermined time period, the excessive error rate being in excess of the threshold error rate, and
        in response to detecting the excessive error rate in the second predetermined time period, execute an override rule that includes stopping authorization requests between the PGW and the PCRF,
    wherein the monitored error rates include rates of denial of service messages from the PCRF to the PGW.

7. The system of claim 6, wherein executing the override rule includes allowing cellular network connection requests from mobile devises received subsequent to stopping the authorization requests between the PGW and the PCRF.

8. The system of claim 6, wherein the threshold error rate is a first threshold error rate, and wherein the outage detection system is further configured to determine a second threshold error rate based at least partially on the excessive error rate.

9. The system of claim 6, wherein the PCRF is a first PCRF, and wherein the override rule includes directing authorization requests for cellular network connection requests received subsequent to stopping the authorization requests between the PGW and the first PCRF to a second PCRF instead of the first PCRF.

10. The system of claim 6, wherein the baseline error rate is an average error rate of the error rates monitored during the first predetermined time period.

11. A computer-implemented method for cellular network outage detection, the method comprising:
    receiving requests for connection to a cellular network from a plurality of mobile devices over the cellular network;

sending, in response to the cellular network connection requests, authorization requests to a network node connected to the cellular network for a first predetermined time period;

monitoring a plurality of first error rates for the authorization requests associated with the network node for the first predetermined time period;

determining a first baseline error rate for the network node based on the plurality of first error rates for the first predetermined time period;

determining a first threshold error rate for the network node based on the first baseline error rate for the network node;

monitoring a plurality of second error rates for authorization requests associated with the network node for a time period subsequent the first predetermined time period;

detecting an excessive error rate of the plurality of second error rates associated with the network node, the excessive error rate exceeding the first threshold error rate;

in response to detecting the excessive error rate, automatically executing a predetermined override rule;

determining a second baseline error rate based on the first baseline error rate and the excessive error rate; and determining a second threshold error rate based at least on the second baseline error rate.

12. The method of claim 11, wherein the override rule includes stopping connection to the network node.

13. The method of claim 11, wherein the plurality of first error rates are associated with key performance indicators (KPI).

14. The method of claim 11, wherein the network node is a policy and charging rules function (PCRF).

15. The method of claim 11, wherein the plurality of first error rates and plurality of second error rates are a measure of denial of service messages received from the network node.

16. The method of claim 11, wherein the network node is a first network node, and wherein the override rule includes directing connection traffic to a second network node of the cellular network.

17. The method of claim 11, wherein the first baseline error rate is a maximum error rate of the plurality of first error rates monitored during the first predetermined time period.

18. The method of claim 11, wherein determining the second threshold error rate includes calculating an average of the second baseline error rate and the excessive error rate.

19. The method of claim 11, wherein the network node is a policy control function (PCF).

20. The method of claim 11, wherein the first baseline error rate is an average of the plurality of first error rates monitored during the first predetermined time period.

* * * * *